(12) United States Patent
Fukuda

(10) Patent No.: US 9,231,009 B2
(45) Date of Patent: Jan. 5, 2016

(54) IMAGE SENSOR AND IMAGING DEVICE

(75) Inventor: Koichi Fukuda, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 212 days.

(21) Appl. No.: 14/004,718

(22) PCT Filed: Mar. 21, 2012

(86) PCT No.: PCT/JP2012/058035
§ 371 (c)(1),
(2), (4) Date: Sep. 12, 2013

(87) PCT Pub. No.: WO2012/128390
PCT Pub. Date: Sep. 27, 2012

(65) Prior Publication Data
US 2014/0001589 A1    Jan. 2, 2014

(30) Foreign Application Priority Data

Mar. 24, 2011 (JP) ................. 2011-066555
Mar. 16, 2012 (JP) ................. 2012-061149

(51) Int. Cl.
H01L 27/00 (2006.01)
H01J 3/14 (2006.01)
H01L 27/146 (2006.01)
H04N 5/225 (2006.01)
H04N 5/369 (2011.01)

(52) U.S. Cl.
CPC ........ *H01L 27/14627* (2013.01); *H01L 27/146* (2013.01); *H01L 27/1463* (2013.01); *H01L 27/14623* (2013.01); *H01L 27/14629* (2013.01); *H04N 5/2254* (2013.01); *H04N 5/3696* (2013.01)

(58) Field of Classification Search
USPC .............. 250/208.1, 216, 226; 257/290–294, 257/414, 428, 431–436, 440, 443–448; 438/57, 60, 64, 65, 66, 69, 70, 73, 75, 438/78, 79, 106, 116, 127
See application file for complete search history.

(56) References Cited

U.S. PATENT DOCUMENTS 8,633,992 B2 * 1/2014 Tsukada ................. G02B 7/38
348/208.12
2007/0154200 A1 * 7/2007 Utagawa ............... H04N 9/045
396/111

FOREIGN PATENT DOCUMENTS

| JP | 58-024105 A | 2/1983 |
| JP | 07-045805 A | 2/1995 |
| JP | 11-087674 A | 3/1999 |
| JP | 2000-156823 A | 6/2000 |

(Continued)

*Primary Examiner* — Pascal M Bui Pho
(74) *Attorney, Agent, or Firm* — Cowan, Liebowitz & Latman, P.C.

(57) ABSTRACT

In an image sensor, if a pixel for focusing has a structure having a light-shielding layer for performing pupil division, between the micro lens and the photoelectric conversion unit, the pixel may be configured such that the focal position of the micro lens is positioned further on the micro lens side than the light-shielding layer, and the distance from the focal position of the micro lens to the light-shielding layer is greater than 0 and less than nFΔ, where n is the refractive index at the focal position of the micro lens, F is the aperture value of the micro lens, and Δ is the diffraction limit of the micro lens. This enables variation in the pupil intensity distribution of the pixel for focusing due to positional production tolerance of components to be suppressed.

2 Claims, 13 Drawing Sheets

(56) References Cited

FOREIGN PATENT DOCUMENTS

| | | |
|---|---|---|
| JP | 2007-059446 A | 3/2007 |
| JP | 2009-016574 A | 1/2009 |
| JP | 2010-169709 A | 8/2010 |
| JP | 2011-029932 A | 2/2011 |

* cited by examiner

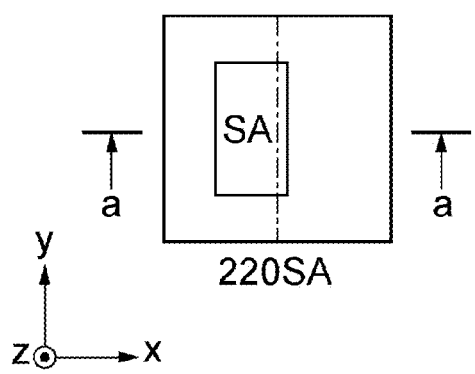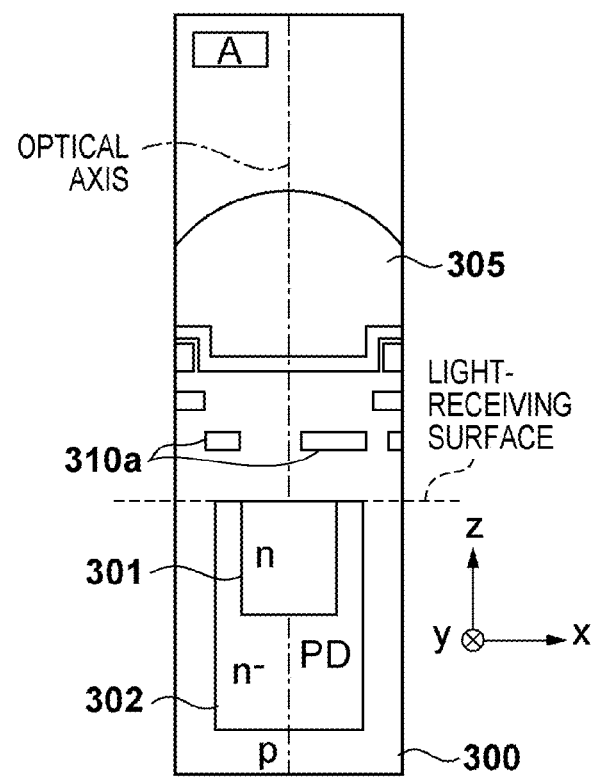
PLAN VIEW      a-a CROSS-SECTIONAL VIEW
F I G. 3A      F I G. 3B

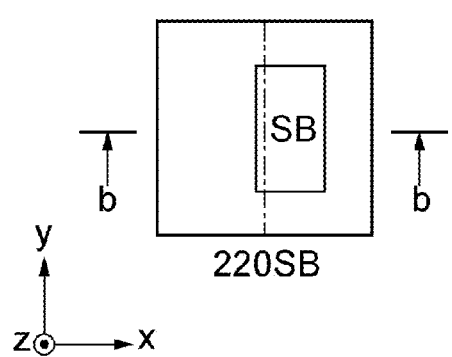
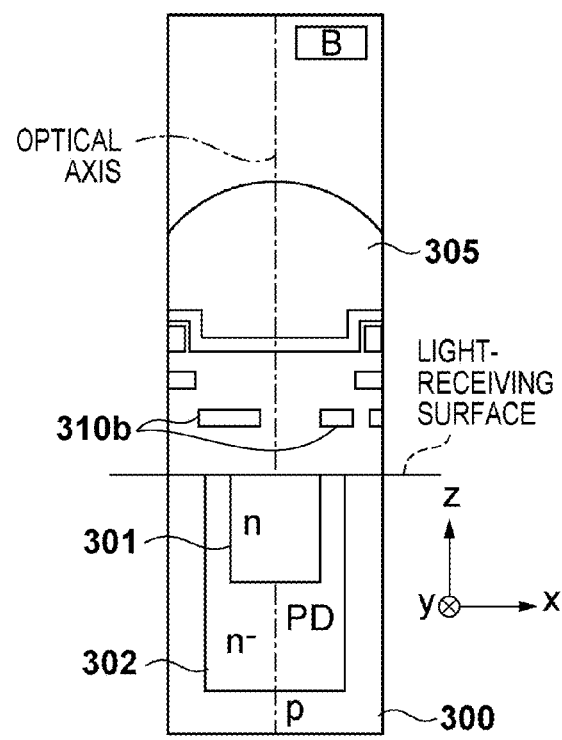
PLAN VIEW
FIG. 4A
b-b CROSS-SECTIONAL VIEW
FIG. 4B

PUPIL DIVISION

PUPIL INTENSITY DISTRIBUTION

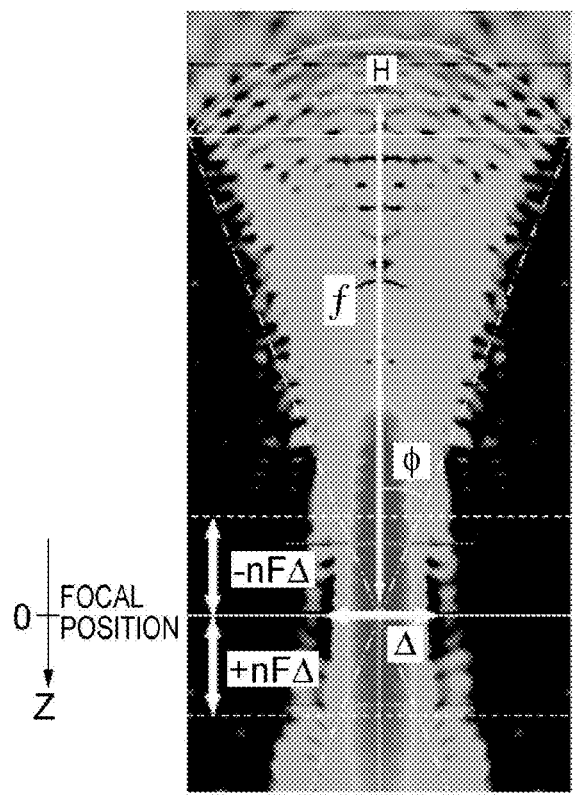 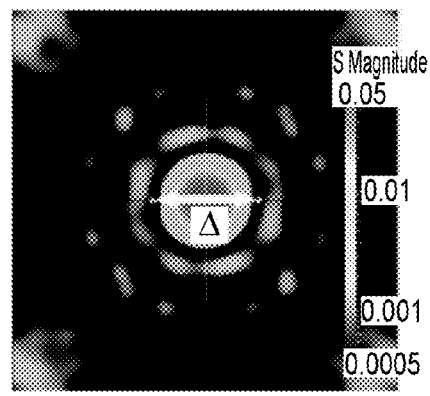
CROSS-SECTIONAL
VIEW PARALLEL
TO OPTICAL AXIS
CROSS-SECTIONAL VIEW
PERPENDICULAR
TO OPTICAL AXIS
F I G. 8A          F I G. 8B

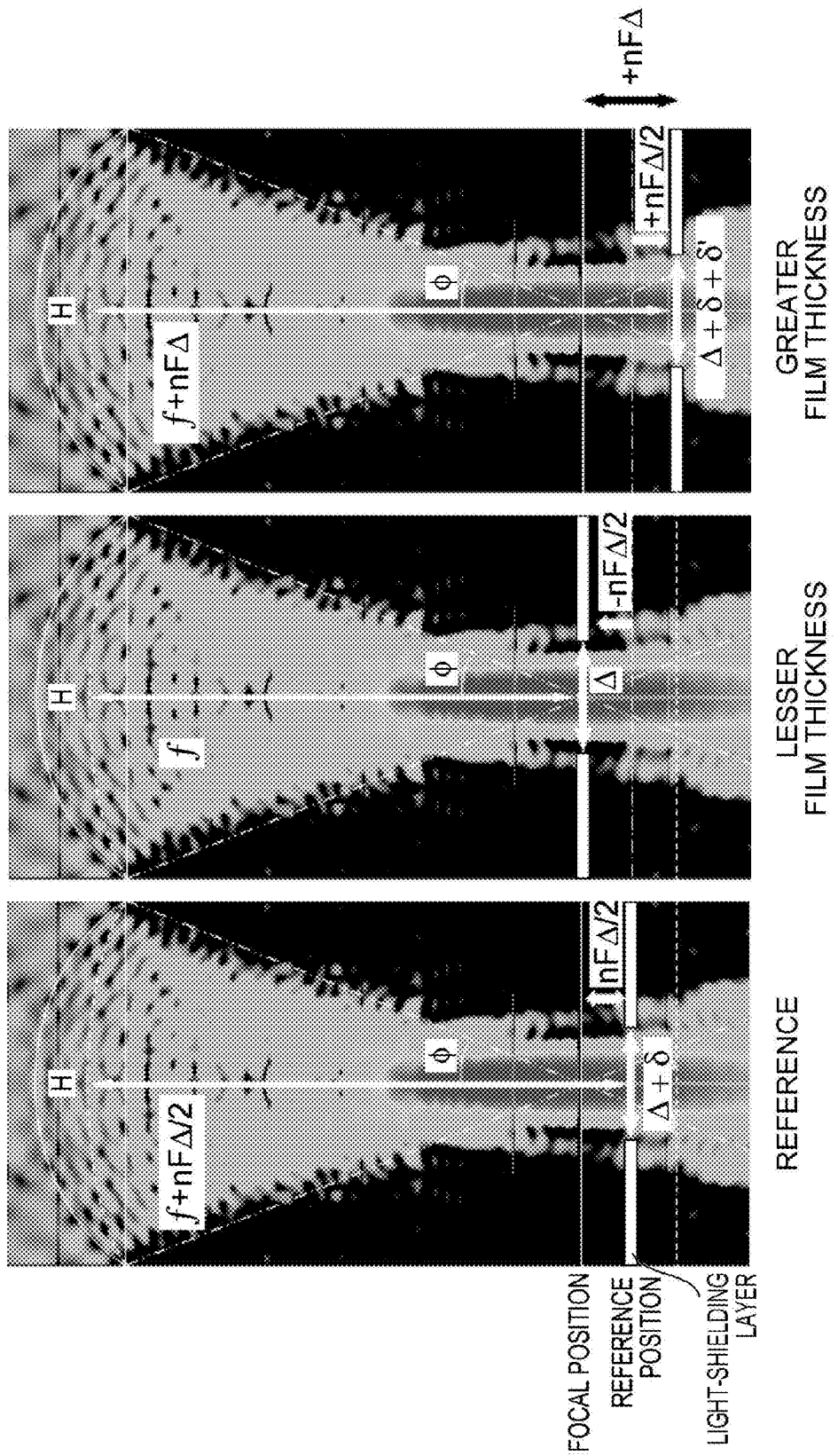

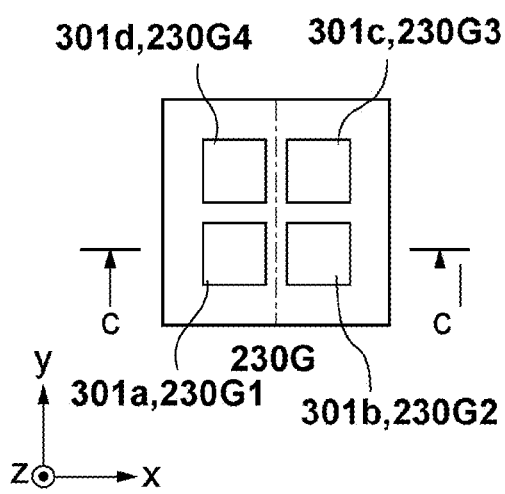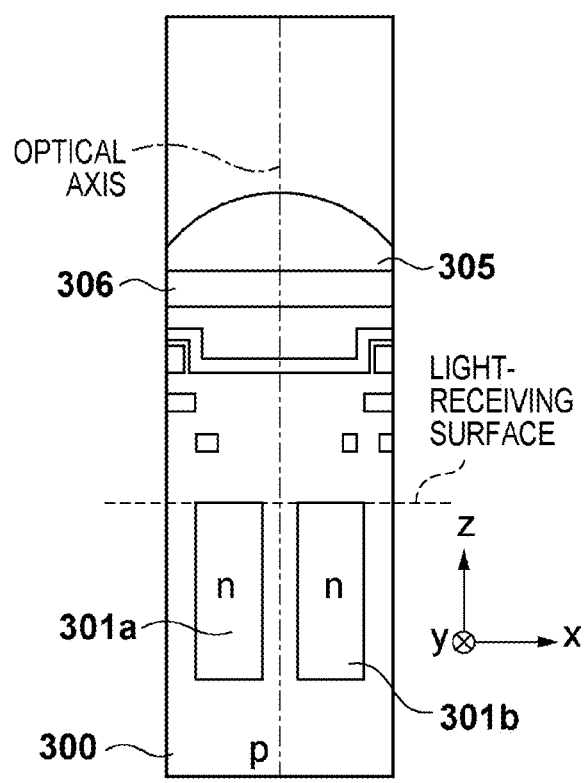
PLAN VIEW     c-c CROSS-SECTIONAL VIEW
F I G.  12A     F I G.  12B

IMAGE SENSOR AND IMAGING DEVICE

CROSS-REFERENCE TO RELATED APPLICATIONS

This application is a national stage application of International Application No. PCT/JP2012/058035, filed Mar. 21, 2012, whose benefit is claimed and which claims the benefit of Japanese Patent Application No. 2011-066555, filed Mar. 24, 2011 and 2012-061149, filed Mar. 16, 2012, whose benefit is also claimed.

TECHNICAL FIELD

The present invention relates to an image sensor and an imaging device.

BACKGROUND ART

Imaging devices have been proposed that perform focus detection of an imaging lens with a phase difference detection method, using a two-dimensional image sensor in which a micro lens is formed in each pixel.

In Japanese Patent Laid-Open No. 58-24105, an imaging device using a two-dimensional image sensor in which a single micro lens and a photoelectric conversion unit divided into a plurality of parts are formed in a single pixel is disclosed. Pupil division is performed as a result of the plurality of photoelectric conversion units being configured so as to receive light from different areas of the exit pupil of the imaging lens through the single micro lens. Focus detection is performed by deriving the difference between images from signals resulting from light received by the individual photoelectric conversion units, and an imaging signal is acquired by adding together the signals resulting from light received by the individual photoelectric conversion units. Also disclosed besides focus detection is enabling display of a three-dimensional image by displaying the signals resulting from light received by the photoelectric conversion units on the right side and the photoelectric conversion units on the left side of each pixel as parallax signals.

In Japanese Patent Laid-Open No. 2000-156823, an imaging device in which plural pairs of pixels for focusing are disposed in a two-dimensional image sensor consisting of a plurality of pixels is disclosed. Pupil division is performed as a result of each pair of pixels for focusing being configured so as to receive light from different areas of the exit pupil of the imaging lens, using a light-shielding layer having an opening. An imaging signal is acquired with pixels for imaging disposed over a large portion of the two-dimensional image sensor, and focus detection is performed by deriving the difference between images from the signals of pixels for focusing disposed over a portion of the two-dimensional image sensor.

In focus detection with the phase difference detection method using a two-dimensional image sensor, focus detection accuracy depends greatly on the pupil intensity distribution (pupil division performance) of the pixels for focusing. Accurate focus detection can be performed by increasing the peak intensity and narrowing the half-value width of the pupil intensity distribution of the pixels for focusing.

However, there is a problem in that variation occurs in the pupil intensity distribution of the pixels for focusing due to positional production tolerance of the components constituting the image sensor, resulting in focus detection accuracy and parallax signals that lack stability.

SUMMARY OF INVENTION

The present invention is made in view of such problems with the conventional technology, and provides an image sensor in which variation in the pupil intensity distribution of pixels for focusing due to positional production tolerance of components is suppressed.

According to one aspect of the present invention, there is provided an image sensor in which a plurality of pixels including a pixel for focusing and a pixel for imaging are two-dimensionally arranged, comprising: a micro lens provided on a light-receiving side of each of the plurality of pixels; a photoelectric conversion unit provided in each of the plurality of pixels, and for receiving light collected by the micro lens; and a light-shielding layer provided between the micro lens and the photoelectric conversion unit of the pixel for focusing, and having an opening whose central point is eccentric relative to a central point of a light-receiving surface of the photoelectric conversion unit of the pixel for focusing, wherein a focal position of the micro lens is positioned further on the micro lens side than the light-shielding layer, and a distance from the focal position of the micro lens to the light-shielding layer is greater than 0 and less than $nF\Delta$, where n is a refractive index at the focal position of the micro lens, F is an aperture value of the micro lens, and $\Delta$ is a diffraction limit of the micro lens.

According to another aspect of the present invention, there is provided an image sensor in which a plurality of pixels are two-dimensionally arranged, comprising: a micro lens provided on a light-receiving side of each of the plurality of pixels; and a plurality of photoelectric conversion units provided in each of the plurality of pixels, and for receiving light collected by the micro lens, wherein the plurality of photoelectric conversion units are disposed such that central points thereof are eccentric relative to a central point of a single light-receiving surface combining light-receiving surfaces of the plurality of photoelectric conversion units, a focal position of the micro lens is positioned further on the micro lens side than the light-receiving surfaces of the plurality of photoelectric conversion units, and a distance from the focal position of the micro lens to the light-receiving surfaces of the plurality of photoelectric conversion units is greater than 0 and less than $nF\Delta$, where n is a refractive index at the focal position of the micro lens, F is an aperture value of the micro lens, and $\Delta$ is a diffraction limit of the micro lens.

According to still another aspect of the present invention, there is provided an image sensor in which a plurality of pixels are two-dimensionally arranged, comprising: a micro lens provided on a light-receiving side of each of the plurality of pixels; a plurality of photoelectric conversion units provided in each of the plurality of pixels, and for receiving light collected by the micro lens; and a plurality of waveguides that are provided between the micro lens and the plurality of photoelectric conversion units, receive light collected by the micro lens on light-receiving surfaces, and guide the received light to light-receiving surfaces of the plurality of photoelectric conversion units, wherein the plurality of photoelectric conversion units are disposed such that central points thereof are eccentric relative to a central point of a single light-receiving surface combining the light-receiving surfaces of the plurality of photoelectric conversion units, a focal position of the micro lens is positioned further on the micro lens side than the light-receiving surfaces of the plurality of waveguides, and a distance from the focal position of the micro lens to the light-receiving surfaces of the plurality of waveguides is greater than 0 and less than $nF\Delta$, where n is a refractive index at the focal position of the micro lens, F is an aperture value of the micro lens, and $\Delta$ is a diffraction limit of the micro lens.

Further features of the present invention will become apparent from the following description of exemplary embodiments with reference to the attached drawings.

BRIEF DESCRIPTION OF DRAWINGS

FIGS. 3A and 3B are a plan view and a vertical cross-sectional view of an A pixel for focusing of the image sensor in the first embodiment of the present invention.

FIGS. 4A and 4B are a plan view and a vertical cross-sectional view of a B pixel for focusing of the image sensor in the first embodiment of the present invention.

FIGS. 8A and 8B are diagrams showing an exemplary light intensity distribution of a cross-section parallel to and a cross-section perpendicular to a micro lens optical axis of the image sensor in the first embodiment of the present invention.

FIGS. 9A to 9C are diagrams showing exemplary positional relations between a light-shielding layer and a light collection position of a micro lens of the image sensor in the first embodiment of the present invention.

FIGS. 12A and 12B are a plan view and a vertical cross-sectional view of a pixel of the image sensor in the second embodiment of the present invention.

DESCRIPTION OF EMBODIMENTS

Exemplary embodiments of the present invention will now be described in detail in accordance with the accompanying drawings.

First Embodiment

Figure 1:
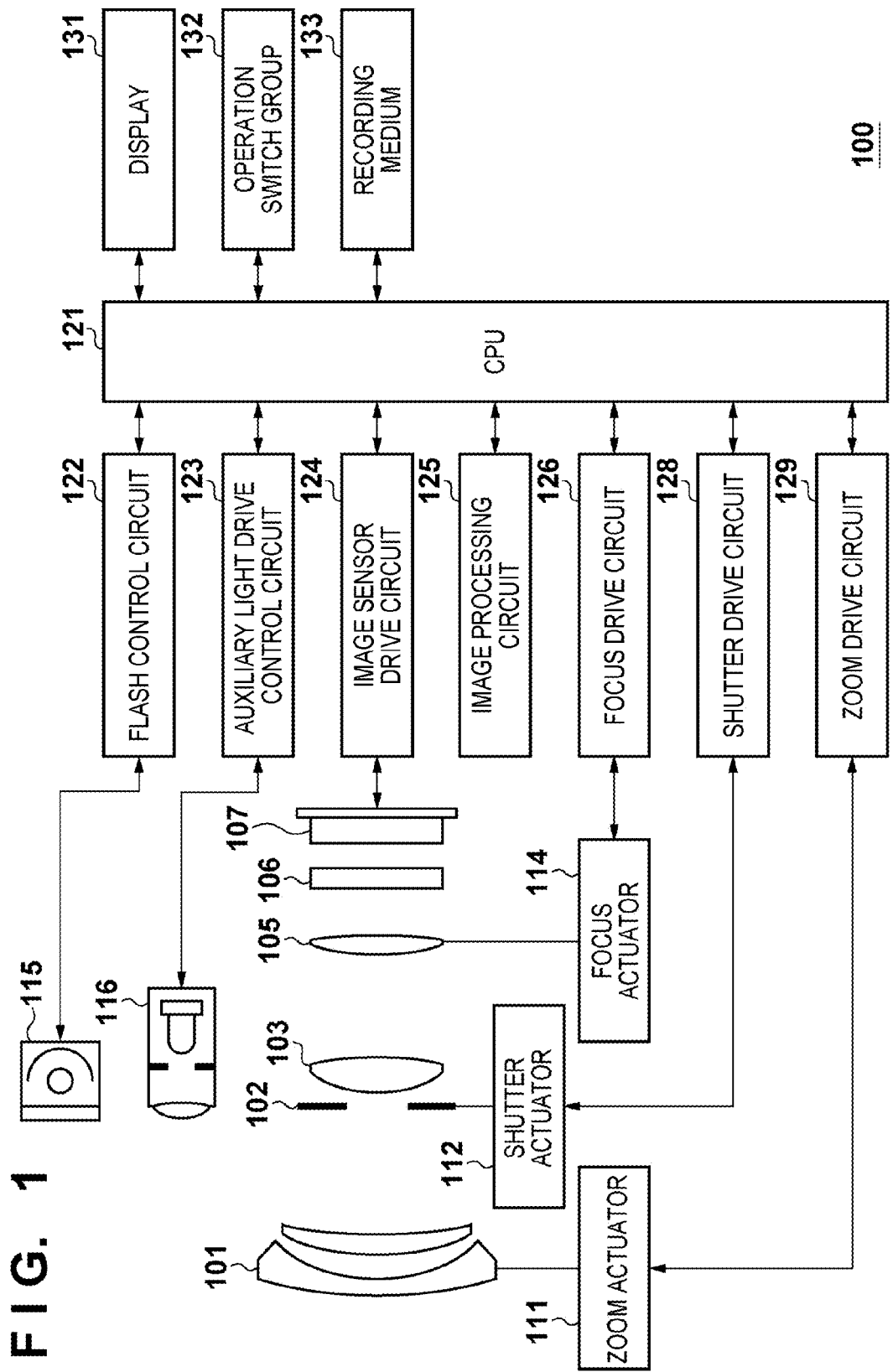
FIG. 1 is a diagram showing an exemplary functional configuration of a digital still camera serving as an exemplary imaging device using an image sensor according to a first embodiment of the present invention.

FIG. 1 is a diagram showing an exemplary functional configuration of a digital still camera 100 (hereinafter, simply camera 100) serving as an exemplary imaging device using an image sensor according to a first embodiment of the present invention.

A first lens group 101 is disposed at the front end of an imaging optical system (image-forming optical system), and is held so as to be movable back and forth along the optical axis. A shutter 102 not only functions as a shutter for controlling the exposure time when capturing a still image but also as a diaphragm that adjusts the amount of light when capturing an image by adjusting the diameter of the aperture. A second lens group 103 disposed on the back face (image sensor side) of the shutter 102 is integrally formed with the shutter 102 so as to be movable back and forth along the optical axis, and realizes a zoom function together with the first lens group 101.

A third lens group 105 is a focal lens that is movable back and forth along the optical axis. An optical low pass filter 106 is disposed in front of an image sensor 107, and reduces false color or moiré that arises in a captured image. The image sensor 107 is constituted by a two-dimensional CMOS image sensor and peripheral circuitry. In the present embodiment, the image sensor 107 is a two-dimensional single-chip color image sensor in which a plurality of light-receiving elements consisting of m pixels in the horizontal direction and n pixels in the vertical direction are two-dimensionally arranged, and thereon are formed primary color mosaic filters in a Bayer arrangement on chip. The color filters restrict the wavelength of transmitted light that is incident on the light-receiving elements per pixel.

A zoom actuator 111 realizes a zoom (magnification) function by rotating an unshown cam tube to drive at least one of the first lens group 101 and the third lens group 105 along the optical axis, in accordance with control of a zoom drive circuit 129. A shutter actuator 112 controls the exposure time when capturing a still image, along with adjusting the amount of captured light by controlling the aperture diameter of shutter 102, in accordance with control of a shutter drive circuit 128.

A focus actuator 114 drives the third lens group 105 along the optical axis, in accordance with control of a focus drive circuit 126.

A flash 115 can be a flash lighting device using a xenon tube, but may be a lighting device provided with an LED for continuous emission. An AF auxiliary light output unit 116 projects an image of a mask having a prescribed opening pattern onto an object through a projection lens, and improves the focus detection capability in relation to a low brightness object or a low contrast object.

A CPU 121 controls the operations of the entire camera 100, and has an arithmetic unit, a ROM, a RAM, an A/D converter, a D/A converter, a communication interface circuit and the like that are not shown. The CPU 121 controls the various circuits of the camera 100 by executing programs stored in the ROM, and realizes functions of the camera 100 such as AF, AE, image processing and recording.

A flash control circuit 122 controls lighting of the flash 115 in synchronous with the imaging operation. An auxiliary light drive control circuit 123 controls lighting of the AF auxiliary light output unit 116 when the focus detection operation is performed. An image sensor drive circuit 124 performs A/D conversion on image signals read out from the image sensor 107 and outputs the resultant signals to the CPU 121, along with controlling operation of the image sensor 107. An image processing circuit 125 applies image processing such as gamma conversion, color interpolation and JPEG coding to image signals.

The focus drive circuit 126 moves the third lens group 105 along the optical axis by driving the focus actuator 114 based on the focus detection result to adjust the focus. The shutter drive circuit 128 controls the aperture diameter and opening/closing timing of the shutter 102 by driving the shutter actuator 112. The zoom drive circuit 129 drives the zoom actuator 111 according to a zoom operation input by the person operating the imaging device pressing a zoom switch included in the operation switch group 132, for example.

A display 131 is an LCD or the like that displays information relating to the imaging mode of the camera 100, a pre-imaging preview image, a post-imaging confirmation image, information on the focusing state during focus detection, and the like. An operation switch group 132 includes a power switch, a release (imaging trigger) switch, a zoom switch and an imaging mode select switch. A recording medium 133 is a detachable semiconductor memory card, for example, that records captured images.

Pixel Arrangement of Image Sensor

Figure 2:
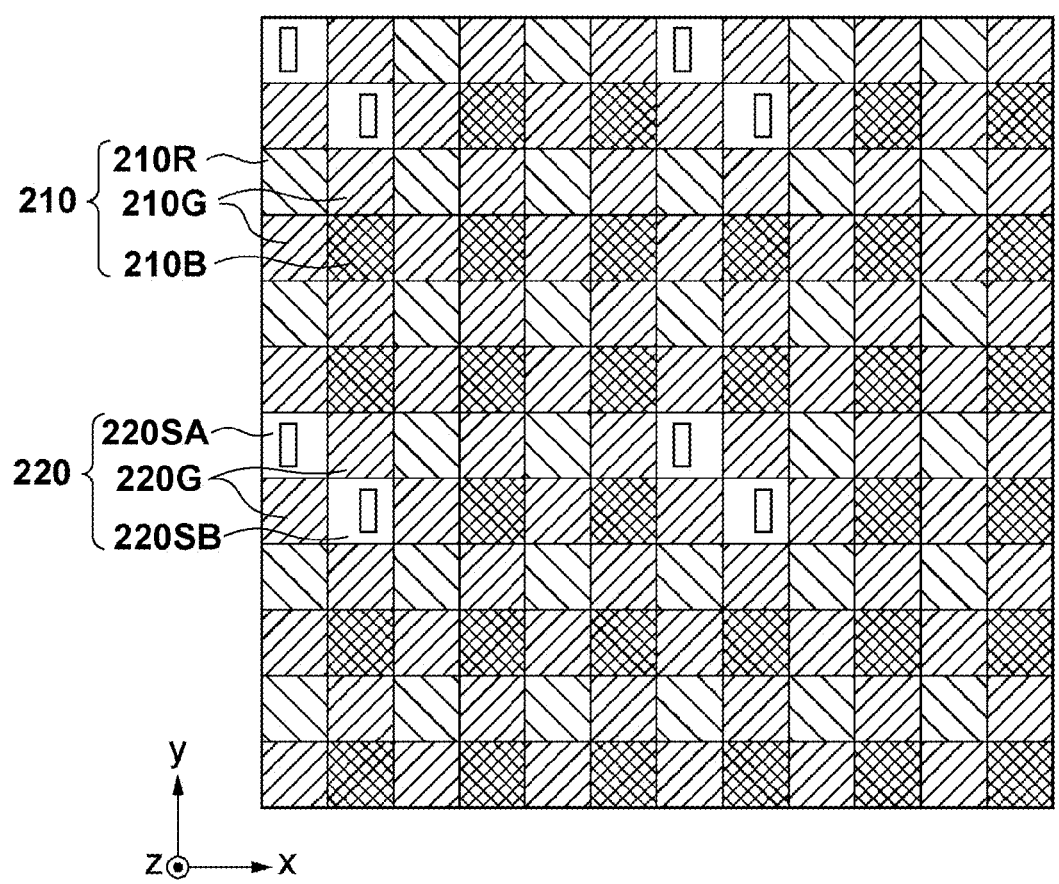
FIG. 2 is a diagram showing an exemplary pixel arrangement of the image sensor in the first embodiment of the present invention.

FIG. 2 is a diagram showing an exemplary pixel arrangement of the image sensor 107 in the present embodiment in an area of 12 columns by 12 rows of pixels. Pixels are disposed on the imaging screen of the image sensor 107 in a similar pattern. In the present embodiment, it is assumed that the imaging screen size of the image sensor 107 is 22.3 mm in length by 14.9 mm in height, the pixel pitch is 4 µm, and the effective pixel count is approximately 20 million pixels consisting of 5575 columns horizontally and 3725 rows vertically.

As shown in FIG. 2, the pixels of the image sensor 107 are constituted by a pixel group 210 for imaging consisting of 2 rows by 2 columns of pixels, and a pixel group 220 for focusing consisting of 2 rows by 2 columns of pixels. The pixel group 210 for imaging consists of two diagonally opposed pixels 210G for imaging having a G (green) spectrum sensitivity, and one each of a pixel 210R for imaging having a R (red) spectrum sensitivity and a pixel 210B for imaging having a B (blue) spectrum sensitivity as the remaining two pixels. Also, the pixel group 220 for focusing consists of two diagonally opposed pixels 220G for imaging having has a G spectrum sensitivity, and a pixel 220SA for focusing and a pixel 220SB for focusing that have a W (white) spectrum sensitivity as the remaining two pixels.

A plan view of the pixel 220SA for focusing seen from the light-receiving surface side (+z side) of the image sensor 107 is shown FIG. 3A, and a cross-sectional view of an a-a cross-section of FIG. 3A seen from the −y side is shown in FIG. 3B. Also, a plan view of the pixel 220SB for focusing seen from the light-receiving surface side (+z side) of the image sensor 107 is shown FIG. 4A, and a cross-sectional view of a b-b cross-section of FIG. 4A seen from the −y side is shown in FIG. 4B.

As shown in FIG. 3B, a photodiode (photoelectric conversion unit) PD having a pin structure in which an n⁻ intrinsic layer 302 is sandwiched between a p-type layer 300 and an n-type layer 301 is formed in the pixel 220SA for focusing. The area of the photoelectric conversion unit PD of the pixel 220SA for focusing is only as large as a depletion layer formed in the n⁻ intrinsic layer 302 of FIGS. 3A and 3B and the diffusion length of a minority carrier around the depletion layer, and is roughly equal to the combined area of the n⁻ intrinsic layer 302 and the n-type layer 301. The n⁻ intrinsic layer 302 may be omitted and replaced by a p-n junction photodiode if necessary.

A micro lens 305 for collecting incident light is formed on the light-receiving side of each pixel, and a light-shielding layer 310a having an opening is formed between the micro lens 305 and the photoelectric conversion unit PD. The pixel 220SA for focusing is configured such that the central point of an opening SA of the light-shielding layer 310a is eccentric in the −x direction relative to the central point of the light-receiving surface of the photoelectric conversion unit.

On the other hand, as shown in FIGS. 4A and 4B, the pixel 220SB for focusing is configured such that the central point of an opening SB of a light-shielding layer 310b is eccentric in the +x direction relative to the central point of the light-receiving surface of the photoelectric conversion unit.

The light-shielding layer 310a (310b) having the opening SA (SB) may also serve as a wiring layer. Also, a color filter may be formed between the micro lens 305 and the photoelectric conversion unit PD if necessary.

Light that is incident on the pixel 220SA (220SB) for focusing shown in FIGS. 3A and 3B (FIGS. 4A and 4B) is collected by the micro lens 305, and a portion of the collected light passes through the opening SA (SB) of the light-shielding layer 310a (310b) and is received by the photoelectric conversion unit PD. In the photoelectric conversion unit PD, electron-hole pairs are generated according the amount of received light and separated by the depletion layer, after which negatively charged electrons are stored in the n-type layer 301 and the holes are discharged outside the image sensor 107 through the p-type layer 300 connected to a constant-voltage source (not shown).

Figure 5:
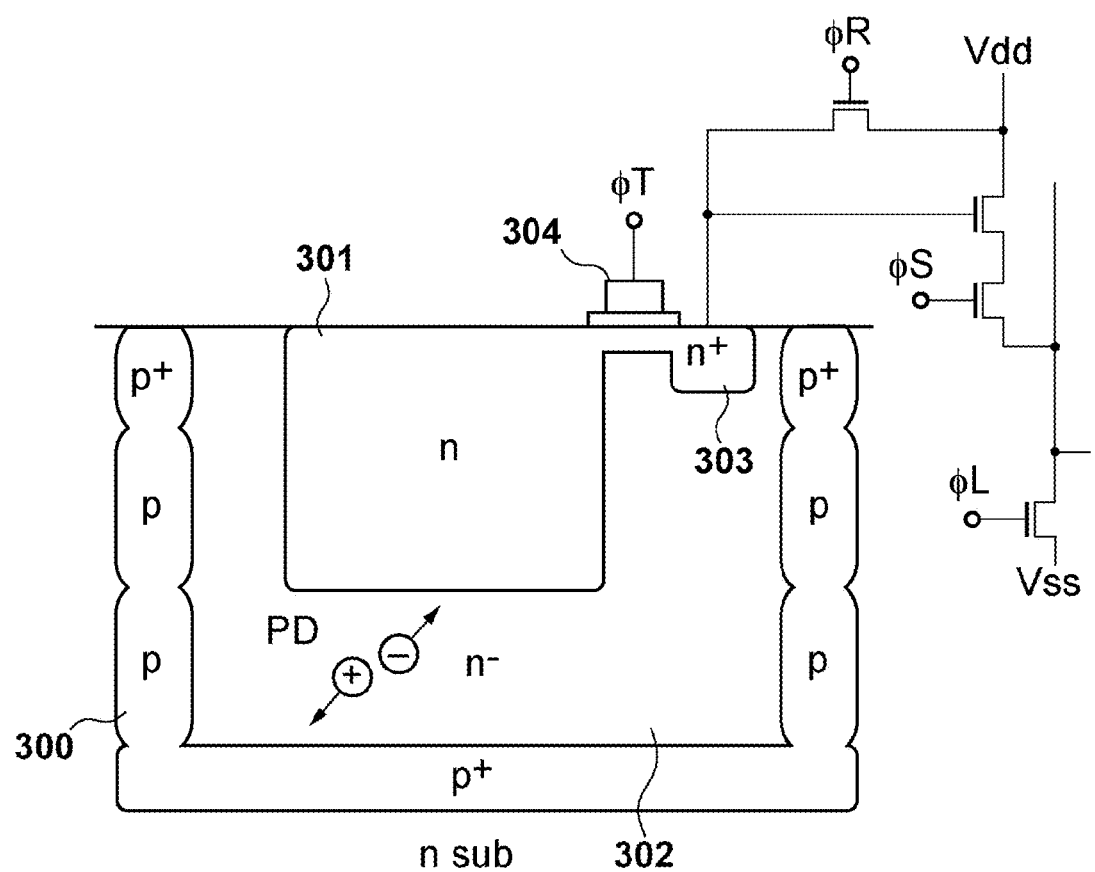
FIG. 5 is a schematic circuit diagram of a pixel for focusing of the image sensor in the first embodiment of the present invention.

Storage operation control of the pixels will now be described. A schematic circuit diagram of the pixel 220SA (220SB) for focusing shown in FIGS. 3A and 3B (FIGS. 4A and 4B) is shown in FIG. 5. In FIG. 5, the same reference numerals are given to the same components as FIGS. 3A, 3B, 4A, and 4B. Reference numeral 303 is an n⁺ floating diffusion area (n⁺ FD) and reference numeral 304 is a transfer gate. Also, Vdd and Vss (Vdd>Vss) are power supply voltages, $\phi T$ is a transfer gate voltage, $\phi R$ is a reset gate voltage, $\phi S$ is a pixel selection gate voltage, and $\phi L$ is a line selection gate voltage. This configuration is also similar for the pixels 210G, 210R, 210B and 220G for imaging.

First, in order to reset the photoelectric conversion unit PD of each pixel, the transfer gate voltage $\phi T$ and the reset gate voltage $\phi R$ of all the rows are turned ON at the same time. The storage operation starts from the moment the transfer gate voltage $\phi T$ and reset gate voltage $\phi R$ are turned off at the same time, and charge is stored in the n-type layer 301 according to the amount of light received by the photoelectric conversion unit PD. After storing charge for a desired time period, the signal charges of the pixels are transferred all together from the n-type layer 301 to the n⁺ FD 303 of each pixel by turning the transfer gate voltage $\phi T$ of all the rows ON and then OFF again. Next, the signal charges transferred to n⁺ FD 303 are read out sequentially row-by-row, by turning the selection gate voltage $\phi Sp$ ON/OFF row-by-row. Also, columns to be read out can be sequentially selected by turning the line selection gate voltage $\phi Ln$ ON/OFF.

The correspondence relation between the opening SA (SB) of the light-shielding layer 310a (310b) of the pixels and pupil division will now be described, with reference to FIGS. 6A to 6C. FIG. 6A and FIG. 6B show the relation between respective cross-sectional views of the pixels 220SA and 220SB for focusing in FIG. 3B and FIG. 4B and the exit pupil plane of the image-forming optical system. Note that in FIG. 6, the x-axis and y-axis of the cross-sectional views have been reversed from FIGS. 3A, 3B, 4A, and 4B, in order to correspond to the coordinate axis of the exit pupil plane. Also, the relation between the vertical cross-sectional view of the pixel 210G (210R, 210B, 220G) for imaging and the exit pupil plane of the image-forming optical system is shown in FIG. 6C.

An exit pupil 400 of the image-forming optical system, a pupil light-receiving area 500 of the pixel for imaging, a pupil light-receiving area 511 of the pixel 220SA for focusing, and a pupil light-receiving area 521 of the pixel 220SB for focusing are shown on the exit pupil plane of FIG. 6.

Light flux from the object passes through the exit pupil 400 of the image-forming optical system and is incident of the respective pixels.

Figures 6A, 6B, 6C:
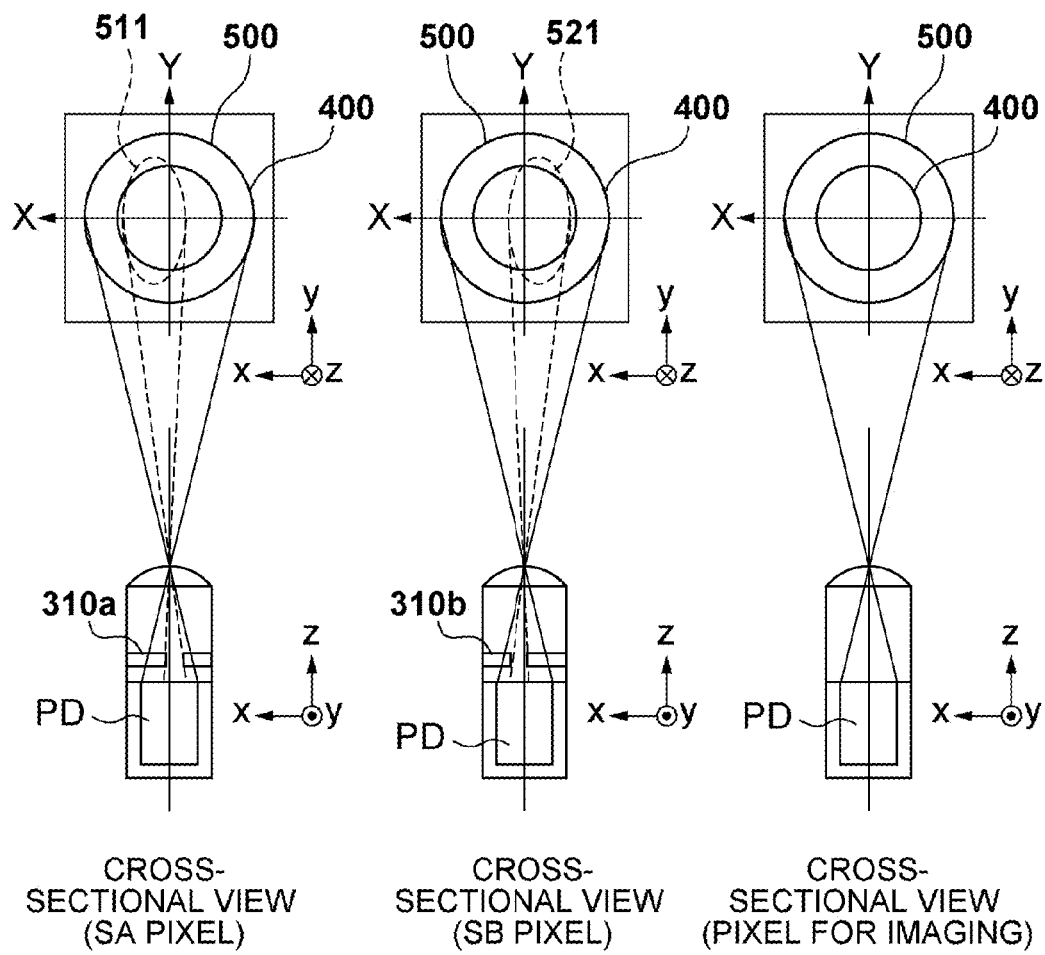
FIGS. 6A to 6C are diagrams illustrating the relation between vertical cross-sections of a pixel for focusing and a pixel for imaging of the image sensor and an exit pupil plane of an image-forming optical system in the first embodiment of the present invention.

In FIG. 6C, the pupil light-receiving area 500 of the pixel for imaging has a roughly conjugate relation with the light-receiving surface of the photoelectric conversion unit PD as a result of the micro lens, and represents the pupil area capable of receiving light in the pixel for imaging. The pupil distance is several tens of millimeters, whereas the diameter of the micro lens is several micrometers. For that reason, the micro lens will have an aperture value of several tens of thousands, and diffraction blur of several tens of millimeters occurs. Therefore, the image on the light-receiving surface of the photoelectric conversion unit PD will have a light-receiving rate distribution (pupil intensity distribution) without becoming a clear pupil light-receiving area.

The pupil light-receiving area 500 of the pixel for imaging is configured such that the light-receiving area is as large as possible so as to enable more of the light flux that passes through the exit pupil 400 to be received, and such that the central point of the pupil light-receiving area 500 of the pixel for imaging roughly coincides with the optical axis.

In FIG. 6A, the pupil light-receiving area 511 of the pixel 220SA for focusing has a roughly conjugate relation with the opening of the light-shielding layer 310a whose central point is eccentric in the −x direction, as a result of the micro lens, and represents the pupil area capable of receiving light in the pixel 220SA for focusing. The pupil light-receiving area 511 of the pixel 220SA for focusing has a smaller light-receiving area than the pupil light-receiving area 500 of the pixel for imaging, and the central point is eccentric to the +X side on the exit pupil plane.

On the other hand, in FIG. 6B, the pupil light-receiving area 521 of the pixel 220SB for focusing has a roughly conjugate relation with the opening of the light-shielding layer 310b whose central point is eccentric in the +x direction, as a result of the micro lens, and represents the pupil area capable of receiving light in the pixel 220SB for focusing. The pupil light-receiving area 521 of the pixel 220SB for focusing has a smaller light-receiving area than the pupil light-receiving area 500 of the pixel for imaging, and the central point is eccentric to the −X side on the pupil face, opposite to the pixel 220SA for focusing.

Figure 7A:
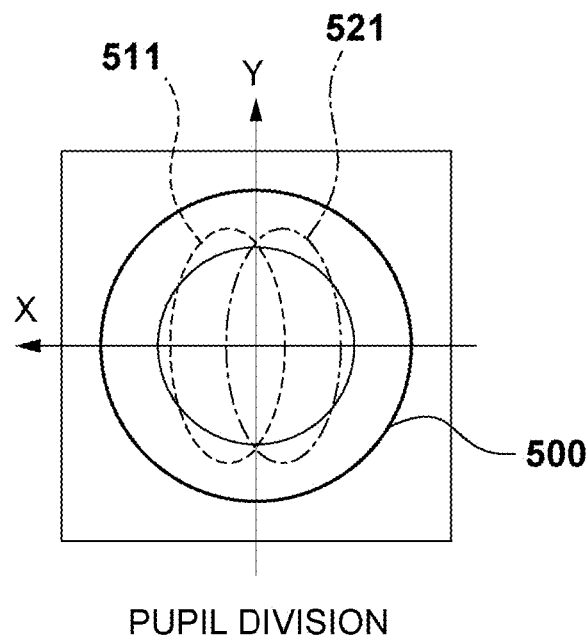
FIGS. 7A and 7B are diagrams showing a schematic of pupil division and exemplary pupil intensity distributions of the image sensor in the first embodiment of the present invention.
Figure 7B:
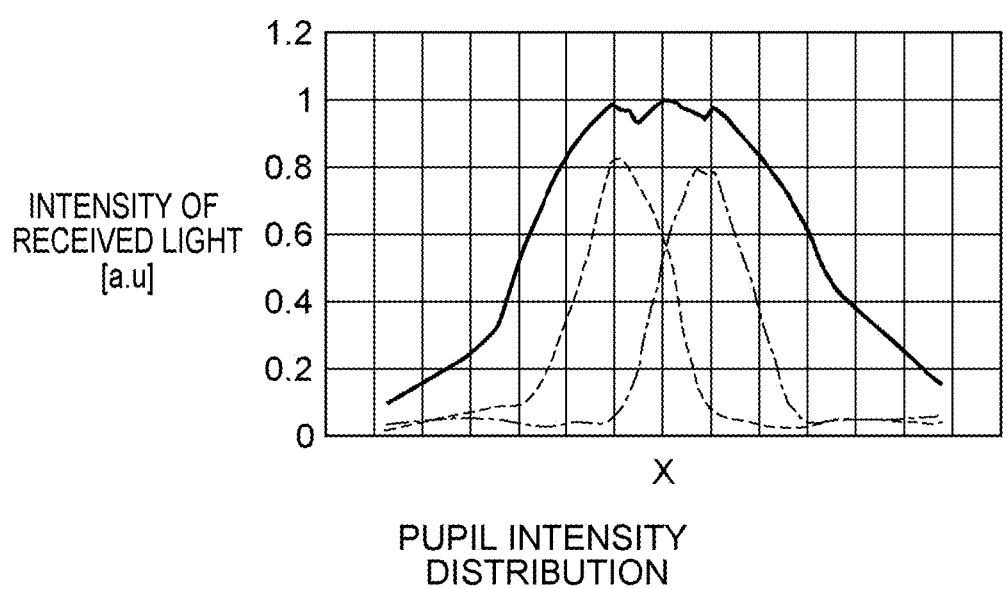

The relation between the pupil light-receiving area 511 of the pixel 220SA for focusing, the pupil light-receiving area 521 of the pixel 220SB for focusing, and the pupil light-receiving area 500 of the pixel for imaging is shown in FIG. 7A. Also, exemplary pupil light-receiving areas (pupil intensity distributions) along the X-axis of the exit pupil plane are respectively shown in FIG. 7B with a broken line for the pixel 220SA for focusing, a dashed-dotted line for the pixel 220SB for focusing, and a solid line for the pixel for imaging. It is clear that the pupil intensity distribution of the pixel 220SA for focusing and the pupil intensity distribution of the pixel 220SB for focusing respectively divide the exit pupil in the X-axis direction. Similarly, when the central point of the opening of the light-shielding layer 310a (310b) is eccentric in the Y-axis direction, the exit pupil can be divided in the Y-axis direction.

As shown in FIG. 2, the pixels 220SA for focusing are regularly arranged in the x direction, and an object image acquired from the group of pixels 220SA for focusing is given as an A image. Similarly, the pixels 220SB for focusing are regularly disposed in the x direction, and an object image acquired from the group of pixels 220SB for focusing is given as a B image. The defocusing amount of an object image having a luminance distribution in the x direction can be detected by detecting the difference between the A image and the B image (relative positions).

The central point of the pupil light-receiving area 511 on the inner side of the exit pupil 400 of the image-forming optical system of the pixel 220SA for focusing in FIG. 6A is given by CA, and the central point of the pupil light-receiving area 521 on the inner side of the exit pupil 400 of the imaging optical system of the pixel 220SB for focusing in FIG. 6B is given by CB. A baseline length is defined by the interval CA-CB between the two central points. The difference between the A image and the B image relative to the defocusing amount increases the larger the absolute value of the baseline length, improving focus detection accuracy.

Configuration of Focal Position

Next, the configuration of the focal position of the micro lens optical system is described.

Exemplary numerical analysis of the light intensity distribution in the case where light is incident on an image sensor in which the micro lens 305 shown in FIGS. 3A, 3B, 4A, and 4B is formed is shown in FIGS. 8A and 8B. The Finite-Difference Time-Domain (FDTD) method is used to calculate the value of electromagnetic waves. An exemplary calculation of the light intensity distribution inside the image sensor in the case where a right-circular polarized plane wave having a wavelength λ of 540 nm is incident parallelly to the optical axis from above the micro lens 305 is given.

An exemplary light intensity distribution of a cross-section parallel to the micro lens optical axis is shown in FIG. 8A. The micro lens optical system in each pixel of the image sensor is constituted by the micro lens 305, a planerizing layer, a sealing layer, an insulating layer, and the like. The micro lens optical system may be configured to include a plurality of micro lenses. The pixel pitch is given by 2a, the focal length of the micro lens optical system is given by f, and the aperture angle of the micro lens optical system is given by 2ϕ. The refractive index at the focal position of the micro lens optical system is given by n. Also, the coordinate along the optical axis is given by z. With the coordinate z, the micro lens side is indicated by a minus sign and the opposite side to the micro lens is indicated by a plus sign, with the focal position as its origin (z=0). The numerical aperture NA of the micro lens optical system is defined by the following equation (1).

$$NA = n \sin \phi \quad (1)$$

Also, an aperture value F of the micro lens optical system is defined by the following equation (2).

$$F = \frac{1}{2n\sin\phi} = \frac{f}{2na} \quad (2)$$

Incident light is collected at the focal position by the micro lens optical system. However, the diameter of a light collection spot cannot be reduced beyond the diffraction limit Δ due to the wave nature of light. Assuming the intensity distribution of the light collection spot approximates an Airy pattern, the diffraction limit Δ is roughly derived by the following equation (3), where λ is the wavelength of incident light.

$$\Delta = 1.22 \frac{\lambda}{n \sin\phi} = 2.44 \lambda F \qquad (3)$$

The light intensity distribution at a cross-section perpendicular to the micro lens optical axis at the focal position is shown in FIG. 8B. At the focal position (z=0), the diameter of the light collection spot will be equal to the diffraction limit $\Delta$, and be at a minimum.

A back depth of focus $+z_D$ and a front depth of focus $-z_D$ of the micro lens optical system are derived by the following equation (4), with the diffraction limit $\Delta$ as the permissible circle of confusion. The range of the depth of focus is $-z_D < z < +z_D$.

$$\pm z_D = \pm n F \Delta \qquad (4)$$

When the intensity distribution of the light collection spot approximates a Gaussian distribution, the relation of the following equation (5) roughly holds, where the diameter w of the light collection spot is a function of the coordinate z.

$$w(z) = \Delta \sqrt{1 + \left(\frac{z}{z_R}\right)^2} \qquad (5)$$

Here, $z_R$ is the Rayleigh length and is defined by $z_R = \alpha_R z_D$, where coefficient $\alpha_R = 0.61$ and $\pi \approx 1.92$.

In the exemplary computation shown in FIGS. 8A and 8B, the wavelength $\lambda$ is 540 nm, the pixel pitch $2a$ is 4.3 μm, the focal length f of the micro lens optical system is 5.8 μm, and the refractive index n at the focal position is 1.46. Also, the aperture value F of the micro lens optical system is 0.924, the diffraction limit $\Delta$ is 1.22 μm, and the depth of focus $z_D$ is 1.65 μm.

In order to achieve excellent light-receiving efficiency and increase the maximum intensity of the pupil intensity distribution, the diameter w of the light collection spot needs to be suppressed relative to the light-receiving surface of the photoelectric conversion unit, the opening of the light-shielding layer, and the like.

The diameter w of the light collection spot increases, following an increase in z, from a minimum at the diffraction limit $\Delta$ in accordance with an above-mentioned equation (5). In particular, in the case where the absolute value of the coordinate z is sufficiently large relative to the Rayleigh length $z_R$ ($|z| \gg z_R$), the diameter w of the light collection spot will increase in proportion to z.

On the other hand, within the range of the depth of focus ($-z_D < z < +z_D$), the diameter w of the light collection spot ($w = \Delta$ in FIG. 8A) hardly changes, as shown in the exemplary calculation of FIG. 8A. The diameter w ($\pm z_D$) of the light collection spot at a position distant by the depth of focus $\pm z_D$ ($=\pm n F \Delta$) from the focal position z=0 is approximately 1.13$\Delta$, based on the above-mentioned equation (5).

Therefore, in the first embodiment, as a first configuration condition, in order to achieve excellent light-receiving efficiency and increase the maximum intensity of the pupil intensity distribution, the light-shielding layer 310$a$ (310$b$) having an opening is configured in a range $-z_D < z < +z_D$ of the depth of focus of the micro lens optical system.

In order to increase the maximum intensity of the pupil intensity distribution of the pixels for imaging, the diffraction limit $\Delta$ desirably is smaller than the pixel pitch $2a$ ($\Delta < 2a$). Also, in order to increase the maximum intensity of the pupil intensity distribution of the pixels for focusing, the diffraction limit $\Delta$ desirably is smaller than a half pixel pitch a ($\Delta < a$).

The angle of incidence of parallel light to the micro lens optical system is given by $\theta$ [radians]. The center of the light collection spot becomes eccentric from the optical axis with a change in the angle of incidence $\theta$. The relation of the following equation (6) roughly holds based on paraxial approximation, where the amount of eccentricity of the light collection spot from the optical axis at angle of incidence $\theta$ and distance f+z from a principal point H is given by q($\theta$, f+z).

$$q(\theta, f+z) = \frac{n_0}{n}(f+z)\theta \qquad (6)$$

Here, $n_0$ is the refractive index of the micro lens optical system on the incident side (opposite side to the photoelectric conversion unit). Normally, $n_0 = 1$ in air.

Also, the relation of the following equation (7) holds, where the rate of eccentric change of the light collection spot at distance f+z from the principal point H (rate of change relative to the angle of incidence of the amount of eccentricity of the light collection spot) is given by c(f+z).

$$c(f+z) = \frac{\partial q(\theta, f+z)}{\partial \theta} = \frac{n_0}{n}(f+z) \qquad (7)$$

In the case where the exit pupil of the imaging optical system is divided by forming the light-shielding layer 310$a$ (310$b$) having an opening at the position of the coordinate z, a single-sided half width $\Gamma$ of the pupil intensity distribution can be roughly estimated by the following equation (8) from equation (5) and equation (7). The single-sided half width $\Gamma$ of the pupil intensity distribution is the amount of change in the angle of incidence at which the intensity of the pupil intensity distribution is half its maximum value.

$$\Gamma(z) = \frac{1}{2}\frac{w(z)}{c(f+z)} = \frac{n}{n_0}\frac{\Delta}{2z_R}\frac{\sqrt{z^2 + z_R^2}}{z+f} \qquad (8)$$

Also, the rate of change relative to the coordinate z of the single-sided half width $\Gamma$ of the pupil intensity distribution is represented by the following equation (9).

$$\Gamma'(z) = \frac{n}{n_0}\frac{\Delta f}{2z_R}\frac{z - z_{min}}{(z+f)^2 \sqrt{z^2 + z_R^2}} \qquad (9)$$

Here, $z_{min} = z_R^2/f > 0$. The rate of change of the single-sided half width $\Gamma$ will be zero at $z = z_{min}$, and the sign changes from minus to plus at $z = z_{min}$. In the exemplary calculation of FIGS. 8A and 8B, $z_{min} = 1.72$ μm. The single-sided half width $\Gamma$ of the pupil intensity distribution will be at a minimum at a position $Z = z_{min} > 0$ that is distant on the photoelectric conversion unit side (opposite side to the micro lens) from the focal position z=0 of the micro lens optical system, and is represented by the following equation (10).

$$\Gamma(z_{min}) = \frac{n}{n_0} \frac{\Delta}{2f} \frac{1}{\sqrt{1 + \frac{z_R^2}{f^2}}} \qquad (10)$$

The position $Z=z_{min}>0$ is also a stationary point, and change in the single-sided half width $\Gamma$ relative to the coordinate z is suppressed around $z_{min}$ on the photoelectric conversion unit side from the focal position.

Therefore, in the first embodiment, as a second configuration condition, in order to suppress change in the single-sided half width $\Gamma$ of the pupil intensity distribution with respect to variation in the film thickness of pixels, the light-shielding layer having an opening is configured at a position (z>0) that is further on the photoelectric conversion unit side than the focal position of the micro lens optical system.

Accordingly, in the first embodiment, the light-shielding layer 310a (310b) having an opening is configured in a range $0<z<z_D$ of the depth of focus on the back side (photoelectric conversion unit side) of the micro lens optical system, based on the first configuration condition and the second configuration condition. More specifically, the pixels are configured such that the focal position of the micro lens optical system is positioned further on the micro lens side than the light-shielding layer having an opening, and the distance from the focal position of the micro lens to the light-shielding layer having an opening is greater than 0 and less than nFΔ.

The effects of such a configuration according to the present embodiment are described using FIGS. 9A to 9C, which are vertical cross-sectional views similar to FIG. 8A. In FIGS. 9A to 9C, the eccentricity of the opening of the light-shielding layer from the optical axis is omitted.

An exemplary calculation of the light intensity distribution in the case where the positional relation of the focal position of the micro lens optical system and the light-shielding layer having an opening conforms to design specifications is shown in FIG. 9A. In the design specifications, the focal position of the micro lens optical system is set to a position (reference position) that is distant from the light-shielding layer having an opening by Δz ($0<\Delta z<z_D$) on the micro lens side. In the example of FIG. 9A, Δz=0.5 nFΔ. At this time, the single-sided half width $\Gamma$ of the pupil intensity distribution is roughly derived by the following equation (8a).

$$\Gamma \propto \frac{\sqrt{(\Delta z)^2 + z_R^2}}{\Delta z + f} \qquad (8a)$$

The denominator of equation (8a) is proportional to the rate of eccentric change of the light collection spot, and the numerator is proportional to the diameter of the light collection spot.

In an actual image sensor, the film thickness from the principal point H of the micro lens optical system to the light-shielding layer having an opening changes from the design specification because of variation in production accuracy.

For example, an exemplary calculation of the light intensity distribution in the case where the film thickness is $\delta z_1$ ($0<\delta z_1<\Delta z$) less than the design specification is shown in FIG. 9B. At this time, the equation representing the single-sided half width $\Gamma$ of the pupil intensity distribution changes from equation (8a) to the following equation (8b).

$$\Gamma \propto \frac{\sqrt{(\Delta z - \delta z_1)^2 + z_R^2}}{(\Delta z - \delta z_1) + f} \approx \frac{\sqrt{(\Delta z)^2 + z_R^2} - \frac{\Delta z}{\sqrt{(\Delta z)^2 + z_R^2}} \delta z_1}{\Delta z + f - \delta z_1} \qquad (8b)$$

In equation (8b), the denominator is slightly smaller than equation (8a), following the decrease in distance from the principal point H to the light-shielding layer having an opening. At the same time, the numerator is also slightly smaller, following the approximating to the focal position. The change in the numerator and the denominator cancel each other out, enabling change in the single-sided half width $\Gamma$ of the pupil intensity distribution to be suppressed.

On the other hand, an exemplary calculation of the light intensity distribution in the case where the film thickness is greater than the design specification by $\delta z_2$ ($0<\delta z_2<z_D-\Delta z$) is shown in FIG. 9C. At this time, the single-sided half width $\Gamma$ of the pupil intensity distribution changes from equation (8a) to the following equation (8c).

$$\Gamma \propto \frac{\sqrt{(\Delta z + \delta z_2)^2 + z_R^2}}{(\Delta z + \delta z_2) + f} \approx \frac{\sqrt{(\Delta z)^2 + z_R^2} + \frac{\Delta z}{\sqrt{(\Delta z)^2 + z_R^2}} \delta z_2}{\Delta z + f + \delta z_2} \qquad (8c)$$

In equation (8c), the denominator is slightly larger than equation (8a), following the increase in distance from the principal point H to the light-shielding layer having an opening. At the same time, the numerator is also slightly larger, following the distancing from the focal position. The change in the numerator and the denominator cancel each other out, enabling the change in the single-sided half width $\Gamma$ of the pupil intensity distribution to be suppressed.

The effects of the present invention will now be described with a specific example. The depth of focus of the micro lens optical system is $z_D=1.65$ μm. Also, as a design specification, the focal position of the micro lens optical system is set to a position that is distant from the light-shielding layer having an opening by $\Delta z=0.2 z_D=0.35$ μm on the micro lens side.

Figure 10:
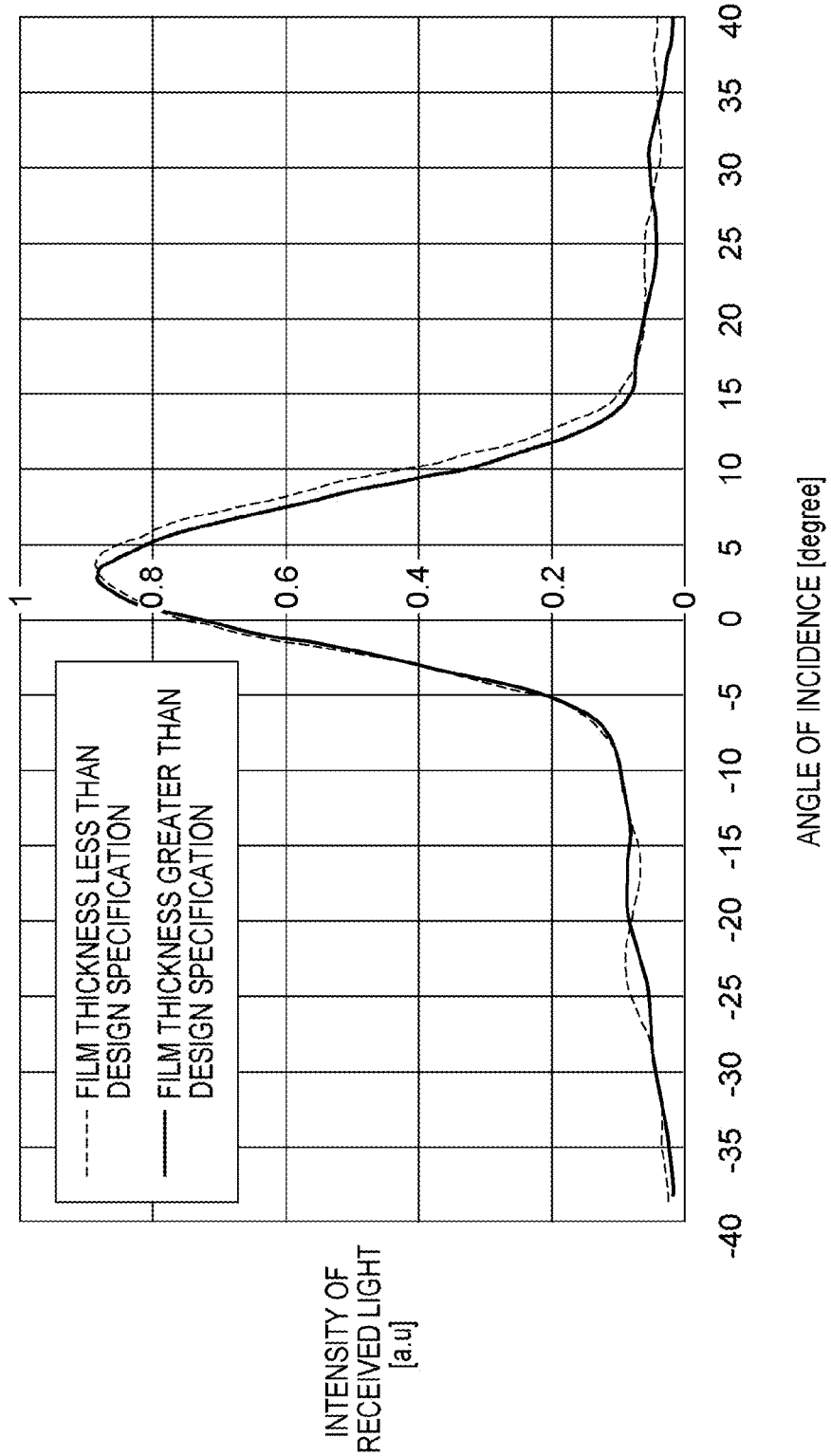
FIG. 10 is a diagram showing pupil intensity distributions for illustrating exemplary effects resulting from the configuration of the image sensor in the first embodiment of the present invention.

In FIG. 10, the pupil intensity distribution in the case where the film thickness is 0.39 μm greater than the design specification is shown with a solid line, and the pupil intensity distribution in the case where the film thickness is 0.35 μm less than the design specification is shown with a broken line. It is thus clear that the pupil intensity distributions are substantially the same in both cases. It is thus clear that change in the pupil intensity distribution can be suppressed with respect to a change in film thickness in a range of 0.74 μm.

According to the present embodiment, as described above, the pixels are configured such that the focal position of the micro lens optical system is positioned further on the micro lens side than the light-shielding layer having an opening, and the distance from the focal position of the micro lens to the light-shielding layer having an opening is greater than 0 and less than nFΔ. Such a configuration enables change in the pupil intensity distribution of the pixels for focusing due to variation in the thickness of the light-shielding layer to be suppressed.

Second Embodiment

Figure 11:
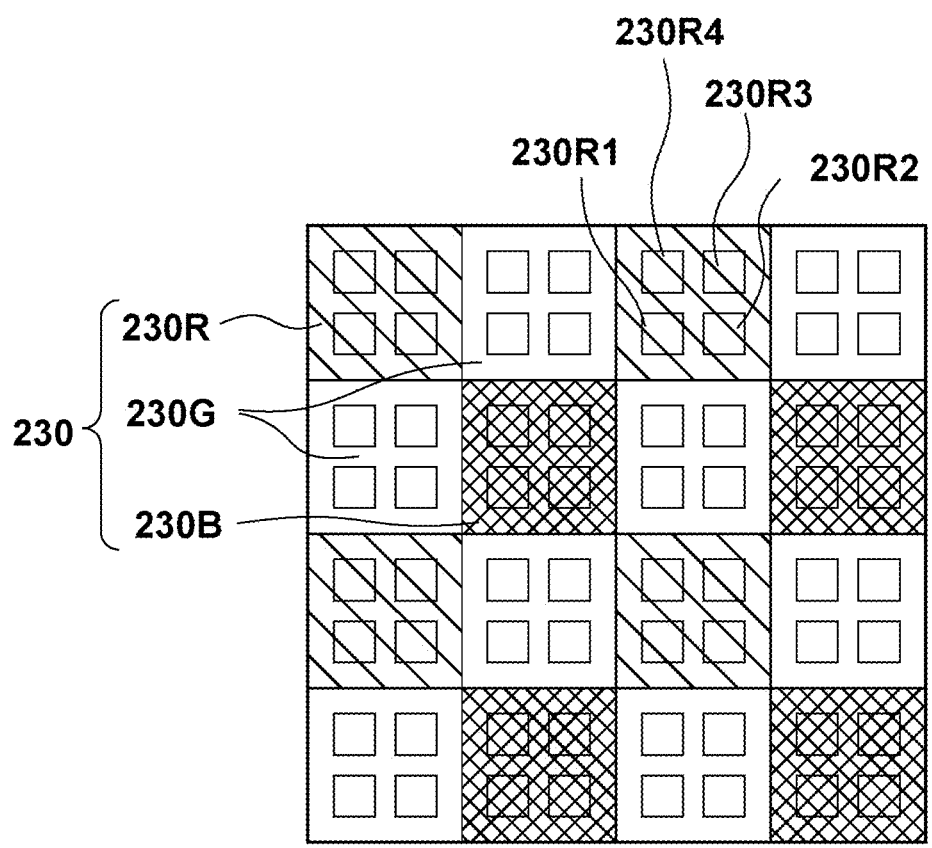
FIG. 11 is a diagram showing an exemplary pixel arrangement of an image sensor in a second embodiment of the present invention.

FIG. 11 is a diagram showing the pixel arrangement of an image sensor according to a second embodiment of the present invention in an area of 4 rows by 4 columns.

In the present embodiment, similarly to the first embodiment, two diagonally opposed pixels 230G having a G spectrum sensitivity and one each of a pixel 230R having an R spectrum sensitivity and a pixel 230B having a B spectrum sensitivity as the remaining two pixels are disposed in a pixel group 230 consisting of 2 rows by 2 columns. A feature of the present embodiment is that the pixels 230R, 230G and 230B are respectively constituted by four auxiliary pixels for pupil division (auxiliary pixels 230R$_1$ to 230R$_4$ in the case of pixel 230R). In the present embodiment, there is no clear distinction structurally between the pixels for focusing and the pixels for imaging, and all of the pixels function as pixels for focusing and also as pixels for imaging.

A plan view of one pixel (here, pixel 230G) of the image sensor seen from the light-receiving surface side (+z side) of the image sensor shown in FIG. 11 is shown in FIG. 12A, and a cross-sectional view of a c-c cross-section of FIG. 12A seen from the −y side is shown in FIG. 12B.

As shown in FIGS. 12A and 12B, in the pixel 230G of the present embodiment, four n-type layers 301a, 301b, 301c and 301d are formed so as to be contained in a p-type layer 300, and respectively constitute photoelectric conversion units (auxiliary pixels) 230G$_1$ to 230G$_4$. The four auxiliary pixels 230G$_1$ to 230G$_4$ are located in positions that are respectively eccentric in the (−x, −y), (+x, −y), (+x, +y), and (−x, +y) directions relative to the center of the pixel 230G. More specifically, the pixels are configured such that the central points of the individual light-receiving surfaces of the four auxiliary pixels 230G$_1$ to 230G$_4$ are eccentric so as to differ from the central point of a single light-receiving surface combining the light-receiving surfaces of the four auxiliary pixels. The light-receiving surfaces of the four eccentric auxiliary pixels are projected onto the exit pupil plane of the image-forming optical system through the micro lens optical system, and the exit pupil is thereby divided into four pupil areas. In the first embodiment, the exit pupil is divided by a light-shielding layer having an opening, whereas in the second embodiment, rather than using a light-shielding layer, the exit pupil is divided by providing a plurality of photoelectric conversion units (auxiliary pixels) in each pixel such that each photoelectric conversion unit receives light from a different pupil area. The image sensor of the present embodiment, in other respects, has a similar configuration to the first embodiment.

In the present embodiment, the light-receiving surfaces of the photoelectric conversion units thus function similarly to the light-shielding layer of the first embodiment. For that reason, by disposing the light-receiving surfaces of the photoelectric conversion units (auxiliary pixels) similarly to the light-shielding layer in the first embodiment, change in the pupil intensity distribution of the pixels for focusing due to variation in the positions of the light-receiving surfaces can be suppressed.

That is, in the present embodiment, the light-receiving surfaces of the photoelectric conversion units are configured in a range $0<z<z_D$ of the back depth of focus of the micro lens optical system. More specifically, the pixels are constituted such that the focal position of the micro lens optical system is positioned further on the micro lens side than the light-receiving surfaces of the photoelectric conversion units, and the distance from the focal position of the micro lens to the light-receiving surfaces of the photoelectric conversion units is greater than 0 and less than nFΔ.

The above configuration enables change in the pupil intensity distribution of the pixels for focusing due to positional production tolerance of the light-receiving surfaces to be suppressed.

Third Embodiment

Figure 13:
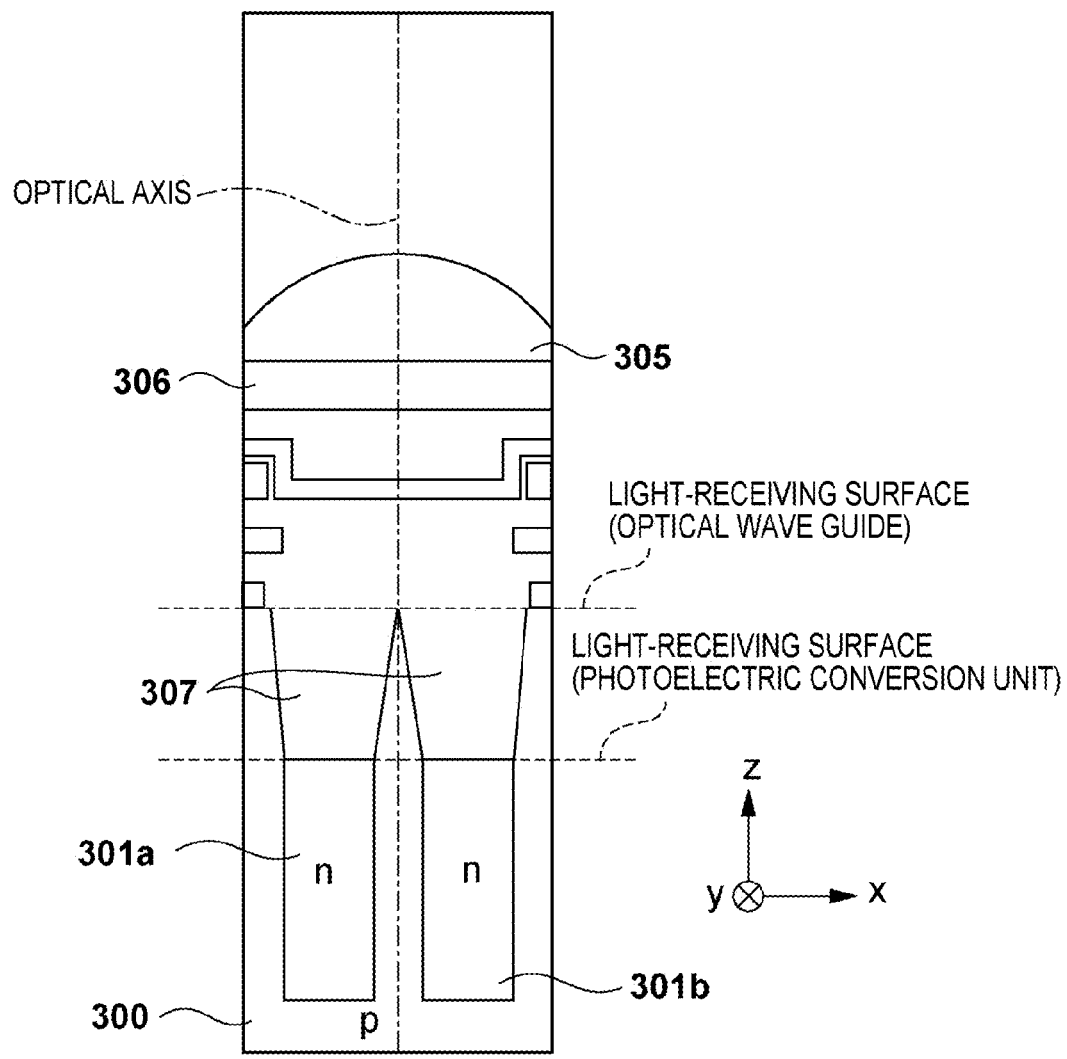
FIG. 13 is a vertical cross-sectional view of a pixel of an image sensor in a third embodiment of the present invention.

FIG. 13 is a cross-sectional view of a single pixel of an image sensor according to a third embodiment of the present invention, similar to FIG. 12B. In the present embodiment, similarly to the second embodiment, each pixel is divided into a plurality of auxiliary pixels. Here, it is assumed that four auxiliary pixels are provided as shown in FIG. 12A. As shown in FIG. 13, in the present embodiment, an optical waveguide 307 is formed on the micro lens side of the light-receiving surface of each photoelectric conversion unit, in order to improve the light-receiving efficiency of the photoelectric conversion units. The optical waveguide 307 is divided per auxiliary pixel.

The central points of the individual light-receiving surfaces of the four optical waveguides 307, similarly to the corresponding photoelectric conversion units, are respectively eccentric in the (−x, −y), (+x, −y), (+x, +y) and (−x, +y) directions relative to the center of the pixel. More specifically, the pixels are configured such that the central points of the individual light-receiving surfaces of the four optical waveguides 307 are eccentric so as to have different central points from the central point of a single light-receiving surface combining the light-receiving surfaces of the four optical waveguides. The light-receiving surfaces of the four eccentric optical waveguides 307 are projected onto the exit pupil plane of the image-forming optical system through the micro lens optical system, and the exit pupil is thereby divided into four pupil areas. The image sensor according to the third embodiment has a similar configuration to the second embodiment except for the exit pupil being divided by disposing the light-receiving surfaces of the optical waveguides eccentrically. In the present embodiment, the light-receiving surfaces of the optical waveguides 307 function similarly to the light-shielding layer of the first embodiment and the photoelectric conversion units of the second embodiment. For that reason, by disposing the light-receiving surfaces of the optical waveguides similarly to the light-shielding layer in the first embodiment or the light-receiving surfaces of the photoelectric conversion units in the second embodiment, change in the pupil intensity distribution of the pixels for focusing due to variation in the position of the light-receiving surfaces of the optical waveguides can be suppressed.

That is, in the present embodiment, the light-receiving surfaces of the optical waveguides are configured in a range $0<z<z_D$ of the back depth of focus of the micro lens optical system. More specifically, the pixels are configured such that the focal position of the micro lens optical system is positioned further on the micro lens side than the light-receiving surfaces of the optical waveguides, and the distance from the focal position of the micro lens to the light-receiving surfaces of the optical waveguides is greater than 0 and less than nFΔ.

The above configuration enables change in the pupil intensity distribution of the pixels for focusing due to positional production tolerance of the light-receiving surfaces of the optical waveguides to be suppressed. Also, providing optical waveguides enables the light-receiving efficiency of the photoelectric conversion units to be improved.

Other Embodiments

Aspects of the present invention can also be realized by a computer of a system or apparatus (or devices such as a CPU or MPU) that reads out and executes a program recorded on a memory device to perform the functions of the above-described embodiment(s), and by a method, the steps of which are performed by a computer of a system or apparatus by, for example, reading out and executing a program recorded on a memory device to perform the functions of the above-described embodiment(s). For this purpose, the program is provided to the computer for example via a network or from a recording medium of various types serving as the memory device (e.g., computer-readable medium).

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application Nos. 2011-066555, filed on Mar. 24, 2011 and 2012-061149, filed Mar. 16, 2012, which are hereby incorporated by reference herein their entirety.

The invention claimed is:

1. An image sensor in which a plurality of pixels are two-dimensionally arranged, comprising:
    a micro lens provided on a light-receiving side of each of the plurality of pixels; and
    a plurality of photoelectric conversion units provided in each of the plurality of pixels, and for receiving light collected by the micro lens,
    wherein the plurality of photoelectric conversion units are disposed such that central points thereof are eccentric relative to a central point of a single light-receiving surface combining light-receiving surfaces of the plurality of photoelectric conversion units,
    a focal position of the micro lens is positioned further on the micro lens side than the light-receiving surfaces of the plurality of photoelectric conversion units, and
    a distance from the focal position of the micro lens to the light-receiving surfaces of the plurality of photoelectric conversion units is greater than 0 and less than $nF\Delta$, where n is a refractive index at the focal position of the micro lens, F is an aperture value of the micro lens, and $\Delta$ is a diffraction limit of the micro lens.

2. An imaging device comprising an image sensor according to claim 1.

* * * * *